(12) United States Patent
Samuels

(10) Patent No.: US 8,211,264 B2
(45) Date of Patent: *Jul. 3, 2012

(54) METHOD FOR PREPARING TRANSPARENT MULTILAYER FILM STRUCTURES HAVING A PERFLUORINATED COPOLYMER RESIN LAYER

(75) Inventor: Sam Louis Samuels, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 151 days.

This patent is subject to a terminal disclaimer.

(21) Appl. No.: 12/795,052

(22) Filed: Jun. 7, 2010

(65) Prior Publication Data

US 2011/0297313 A1 Dec. 8, 2011

(51) Int. Cl.
- B29C 65/00 (2006.01)
- B29C 45/00 (2006.01)
- B29C 47/00 (2006.01)
- B29C 43/02 (2006.01)
- B29C 49/00 (2006.01)
- B29C 51/00 (2006.01)
- B29C 39/14 (2006.01)
- B29C 49/08 (2006.01)
- B29C 55/00 (2006.01)
- B29C 67/20 (2006.01)
- B29C 43/10 (2006.01)
- B31B 1/60 (2006.01)
- B32B 37/00 (2006.01)
- B29D 24/00 (2006.01)
- B29D 29/00 (2006.01)
- B29D 7/00 (2006.01)
- B29B 15/00 (2006.01)

(52) U.S. Cl. .......... 156/285; 156/286; 156/60; 264/511; 264/553; 264/566; 264/568; 264/571

(58) Field of Classification Search .................. 156/60, 156/285, 286; 264/511, 553, 566, 568, 571
See application file for complete search history.

(56) References Cited

U.S. PATENT DOCUMENTS

| | | |
|---|---|---|
| 2,632,921 A | 3/1953 | Kreidl |
| 2,648,097 A | 8/1953 | Kritchever |
| 2,683,894 A | 7/1954 | Kritchever |
| 2,704,382 A | 3/1955 | Kreidl |
| 2,897,183 A | 7/1959 | Christl et al. |
| 3,030,290 A | 4/1962 | Ryan, Jr. |
| 3,234,062 A | 2/1966 | Morris |
| 3,350,372 A | 10/1967 | Anspon et al. |
| 3,404,134 A | 10/1968 | Rees |
| 3,676,181 A | 7/1972 | Kowalewski |
| 3,756,996 A | 9/1973 | Pugh et al. |
| 3,852,136 A | 12/1974 | Plumat et al. |
| 4,029,868 A | 6/1977 | Carlson |
| 4,341,576 A | 7/1982 | Lewis |
| 4,351,931 A | 9/1982 | Armitage |
| 4,385,951 A | 5/1983 | Pressau |
| 4,398,979 A | 8/1983 | Cathers et al. |
| 4,732,814 A | 3/1988 | Hatada et al. |
| 5,028,674 A | 7/1991 | Hatch et al. |
| 5,415,909 A | 5/1995 | Shohi et al. |
| 5,532,066 A | 7/1996 | Latiolais et al. |
| 5,536,347 A | 7/1996 | Moran |
| 5,583,057 A | 12/1996 | Inoue |
| 5,677,404 A | 10/1997 | Blair |
| 5,853,516 A | 12/1998 | Lehto |
| 6,075,202 A | 6/2000 | Mori et al. |
| 6,204,443 B1 | 3/2001 | Kiso et al. |
| 6,320,115 B1 | 11/2001 | Kataoka et al. |
| 6,323,416 B1 | 11/2001 | Komori et al. |
| 6,342,116 B1 | 1/2002 | Balduin et al. |
| 6,414,236 B1 | 7/2002 | Kataoka et al. |
| 6,521,825 B2 | 2/2003 | Miura et al. |
| 6,541,588 B1 | 4/2003 | Kaulbach et al. |
| 6,726,979 B2 | 4/2004 | Friedman et al. |
| 6,753,087 B2 | 6/2004 | Jing et al. |
| 6,762,508 B1 | 7/2004 | Kiso et al. |
| 6,818,819 B2 | 11/2004 | Morizane et al. |
| 6,963,120 B2 | 11/2005 | Shiozaki et al. |
| 6,972,068 B1 | 12/2005 | Kobayashi et al. |
| 7,638,186 B2 | 12/2009 | Hull et al. |
| 2004/0182493 A1 | 9/2004 | Chick |
| 2007/0267059 A1 | 11/2007 | Nishijima et al. |
| 2007/0292685 A1 | 12/2007 | Brothers et al. |
| 2008/0023063 A1 | 1/2008 | Hayes et al. |
| 2008/0023064 A1 | 1/2008 | Hayes et al. |
| 2008/0169023 A1 | 7/2008 | Nishijima et al. |
| 2008/0264471 A1 | 10/2008 | Hayes |
| 2008/0264481 A1 | 10/2008 | Hayes |
| 2009/0120489 A1 | 5/2009 | Nishijima et al. |
| 2009/0183773 A1 | 7/2009 | Samuels et al. |
| 2009/0255571 A1 | 10/2009 | Xia et al. |
| 2011/0023943 A1 | 2/2011 | Prejean |

(Continued)

FOREIGN PATENT DOCUMENTS

CA 2388107 A1 5/2001

(Continued)

OTHER PUBLICATIONS

McDermott et al, "Tetrafluoroethylene Hexafluoropropylene Copolymer Modified With Perfluoropropyl Vinyl Ether", US Statutory Invention Registration, Sep. 2, 1986; REG. No. H130.

(Continued)

*Primary Examiner* — Khanh P Nguyen
*Assistant Examiner* — Matthew Hoover

(57) ABSTRACT

Disclosed is a method for preparing a multilayer film laminate having a first film layer comprising a perfluorinated copolymer resin layer adhered to a polymeric second film layer that has been surface treated with an aminosilane. The multilayer laminate is useful as a photovoltaic module component. Methods for preparing photovoltaic modules that include the multilayer laminate are also disclosed.

20 Claims, No Drawings

FOREIGN PATENT DOCUMENTS

| | | |
|---|---|---|
| EP | 0577985 B1 | 2/1997 |
| EP | 0769818 A2 | 4/1997 |
| EP | 1065731 A2 | 1/2001 |
| EP | 1182710 A1 | 2/2002 |
| FR | 2539419 A1 | 3/1987 |
| JP | 200186114 A | 7/2000 |
| JP | 2001144313 | 5/2001 |
| JP | 2004031445 | 1/2004 |
| JP | 2004058583 | 2/2004 |
| JP | 2006032308 | 2/2006 |
| JP | 2006190867 | 7/2006 |
| WO | 9101880 A1 | 2/1991 |
| WO | 03057478 A1 | 7/2003 |
| WO | 2004019421 A1 | 3/2004 |
| WO | 2009/085683 A2 | 7/2009 |

OTHER PUBLICATIONS

Chou et al, "High Flexibility EMA Made From High Pressure Tubular Process", 60$^{th}$ Annual Technical Conference-Society of Plastic Engineers, 2002; vol. 2, 1832-1836.

Pern et al, "Adhesion Strength Study of EVA Encapsulants on Glass Substrates", National Center for Photovoltaics and Solar Program Review Meeting Mar. 24-26, 2003; May 2003, NREL, Golden Colorado.

French et al, Optical Properties of Materials for Concentrator Photovoltaic Systems, Photovoltaic Specialists Conference, 34$^{th}$ IEEE, Piscataway, NJ, Jun. 7, 2009, pp. 394-399.

METHOD FOR PREPARING TRANSPARENT MULTILAYER FILM STRUCTURES HAVING A PERFLUORINATED COPOLYMER RESIN LAYER

FIELD OF THE INVENTION

The present invention is directed to a method for preparing multilayer films that comprise a layer consisting essentially of a perfluorinated copolymer resin. The invention is further directed to photovoltaic modules that comprise the multilayer films.

BACKGROUND OF THE INVENTION

Photovoltaic (PV) modules (also known as solar modules) are used to produce electrical energy from sunlight, offering an environmentally friendly alternative to traditional methods of electricity generation. Such modules are based on a variety of semiconductor cell systems that can absorb light and convert it into electrical energy and are typically categorized into one of two types of modules based on the light absorbing material used, i.e., bulk or wafer-based modules and thin film modules. Generally, individual cells are electrically connected in an array to form a module, and such an array of modules can be connected together in a single installation to provide a desired amount of electricity.

When the light absorbing semiconductor material in each cell and the electrical components used to transfer the electrical energy produced by the cells are suitably protected from the environment, photovoltaic modules can last 25, 30, and even 40 or more years without significant degradation in performance. In a typical photovoltaic module construction, the solar cell layer is sandwiched between two encapsulant layers, which layers are further sandwiched between frontsheet and backsheet layers, providing weather resistance, UV resistance, moisture barrier properties, low dielectric constant, and high breakdown voltage.

Fluoropolymer films are recognized as useful components in photovoltaic modules due to their excellent strength, weather resistance, UV resistance, moisture barrier properties, low dielectric constant, and high breakdown voltage and can play a role in both wafer-based and thin film modules. For example, fluoropolymer films, such as ethylene-tetrafluoroethylene copolymer (ETFE) films, may be used as frontsheets in photovoltaic modules instead of the more common glass layers. Challenges associated with using fluoropolymer films as frontsheets include providing the desired combination of barrier properties and transparency, as well as providing good adhesion to an adjacent encapsulant layer. For instance, higher transparency will improve solar module efficiency in converting sunlight into electricity, but achieving higher transparency typically requires the use of thinner fluoropolymer films, which reduces strength, weather resistance, UV resistance, and moisture barrier properties. Furthermore, the reduced barrier properties of thinner films can result in more rapid degradation of the encapsulant layer, reducing the overall performance of the module. ETFE films have become the most widely used fluoropolymer materials for manufacture of PV frontsheets due to the excellent adhesion of ETFE to ethylene vinyl acetate copolymers (EVA) which is the most commonly used material for encapsulant layers.

EVA copolymers have been favored encapsulant materials because they are characterized by low melting temperatures, which allows them to readily flow around and seal the solar cell components. However, the low melting temperature properties of EVA copolymers generally necessitate subsequent crosslinking of the polymer so as to impart suitable thermal stability to the resultant photocells. Therefore, alternative materials that exhibit higher thermal dimensional stability without crosslinking have been developed for use in encapsulant layers.

In addition, encapsulant materials have been compounded with silane coupling agents, including aminosilanes, to improve adhesion to fluoropolymer layers. (See U.S. Pat. Nos. 6,963,120 and 6,762,508; U.S. Patent Application Publications 2009/0183773, 2009/0120489, 2009/0255571, 2008/0169023, 2008/0023063, 2008/0023064 and 2007/0267059; U.S. Patent Application No. 61/230,238; European Patent Application 1065731; French Patent 2539419 and Japanese Patent Applications 2000/186114, 2001/144313, 2004/031445, 2004/058583, 2006/032308 and 2006/1690867).

U.S. Pat. No. 6,753,087 discloses a multilayer structure including a fluoropolymer bonded to a substrate. The structure is prepared by treating a surface of the fluoropolymer with a bonding composition that includes an amino-substituted organosilane, contacting a substrate with the treated surface of the fluoropolymer and heating to form a bond. U.S. Patent Application Publications 2008/0023063, 2008/0023064, 2008/0264471 and 2008/0264481 describe solar cells in which one or both surfaces of any of the solar cell laminate layers may be treated with a silane that incorporates an amine function.

U.S. Pat. No. 7,638,186 and European Patent Application Publication EP577985 disclose the use of tetrafluoroethylene-hexafluoropropylene copolymers, commonly referred to as FEP, as back sheet layers in photovoltaic modules. PCT Patent Application Publication WO2004/019421 discloses FEP used as a front sheet layer in photovoltaic modules.

Alternatives to ETFE films that exhibit higher transparency and/or better barrier properties would be desirable, particularly for use in flexible solar cell modules where the use of rigid glass is not feasible. Additionally, the alternatives materials would desirably have adequate adhesion to encapsulant materials under adverse conditions to enable their use in photovoltaic modules.

SUMMARY OF THE INVENTION

The present invention provides a method for preparing a transparent multilayer film laminate comprising at least a first film layer and a second film layer, the method comprising:

A. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;

B. providing a second film layer comprising a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof;

C. treating a surface of the second film layer with an aminosilane coupling agent to provide a surface-treated second film layer;

D. contacting a treated surface of the surface-treated second film layer with the modified surface of the first film layer; and E. adhering the first film layer to the second surface-treated film layer by the application of heat and optionally pressure or vacuum to form a multilayer film laminate;

wherein the multilayer film laminate is characterized by (i) having an average peel strength between the first film layer and the second surface-treated film layer of greater than 2 lbf/in, measured after exposing the multilayer film laminate to conditions of 85° C. and 85% relative humidity for 1000 hours, with the proviso that when the second film layer comprises an ethylene vinyl acetate copolymer, the multilayer film laminate is maintained at a sufficient temperature for a time sufficient to crosslink the ethylene vinyl acetate copolymer prior to exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

A transparent multilayer film laminate prepared by the method of the invention may be used as an integrated frontsheet that can be incorporated into a photovoltaic module.

Accordingly, the invention is further directed to a method for preparing a photovoltaic module, the method comprising the steps:

A. providing a solar cell layer;

B. providing a transparent multilayer film laminate that is larger in area than the solar cell layer, the multilayer film laminate comprising at least a first film layer and a second film layer, wherein 1. the first film layer comprises a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;

2. the second film layer comprises a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof, wherein a surface of the second film layer has been treated with an aminosilane coupling agent to provide a surface-treated second film layer; and 3. the multilayer film laminate is characterized by (i) having an average peel strength between the first film layer and the second surface-treated film layer of greater than 2 lbf/in, measured after exposing the multilayer film laminate to conditions of 85° C. and 85% relative humidity for 1000 hours, with the proviso that when the second film layer comprises an ethylene vinyl acetate copolymer, the ethylene vinyl acetate is a crosslinked ethylene vinyl acetate; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical;

C. overlaying the solar cell layer with the multilayer film laminate such that 1. a surface of the second film layer of the multilayer film laminate contacts the solar cell layer;

2. a portion of the second film layer of the multilayer film laminate extends beyond the perimeter of the solar cell layer; and 3. the portion of the second film layer of the multilayer film laminate that extends beyond the perimeter of the solar cell layer contacts an additional layer that is an encapsulant layer; and D. adhering the second film layer of the multilayer film laminate to the solar cell layer and the encapsulant layer by the application of heat and optionally pressure or vacuum to provide a photovoltaic module.

The invention also provides a method for preparing a photovoltaic module in one lamination operation. That is, the invention provides a method for preparing a photovoltaic module comprising a multilayer laminate, the method comprising the steps:

A. providing a solar cell layer;

B. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;

C. providing a second film layer having an upper and a lower surface, the second film layer being larger in area than the solar cell layer, wherein the second film layer comprises a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof;

D. treating the upper surface of the second film layer with an aminosilane coupling agent to provide a surface-treated second film layer;

E. contacting a modified surface of the first film layer with the treated upper surface of the surface-treated second film layer;

F. contacting the solar cell layer with the second film layer such that 1. the lower surface of the second film layer contacts the solar cell layer;

2. a portion of the second film layer extends beyond the perimeter of the solar cell layer; and 3. the portion of the second film layer that extends beyond the perimeter of the solar cell layer contacts another layer that is an encapsulant layer; and G. adhering the second film layer to the first film layer, the solar cell layer and the encapsulant layer by the application of heat and optionally pressure or vacuum to provide a photovoltaic module;

wherein the photovoltaic module is characterized by (i) having an average peel strength between the first film layer and the second surface-treated film layer of greater than 2 lbf/in, measured after exposing the photovoltaic module to conditions of 85° C. and 85% relative humidity for 1000 hours with the proviso that when the second film layer comprises an ethylene vinyl acetate copolymer, the photovoltaic module is maintained at a sufficient temperature for a time sufficient to crosslink the ethylene vinyl acetate copolymer prior to exposing the photovoltaic module to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

DETAILED DESCRIPTION

The following definitions are used herein to further define and describe the disclosure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to.

In this application, the terms "sheet", "layer" and "film" are used in their broad sense interchangeably. A "frontsheet" is a sheet, layer or film positioned as the outermost layer on the side of a photovoltaic module that faces a light source and may also be described as an incident layer. Because of its location, it is generally desirable that the frontsheet has high transparency to the desired incident light. It is also desirable that the frontsheet has high moisture barrier properties to prevent entry of moisture into the photovoltaic module. Such moisture intrusion can degrade the photovoltaic module components and/or reduce the electrical efficiency of the module. A "backsheet" is a sheet, layer or film on the side of a photovoltaic module that faces away from a light source, and is often opaque. In some instances, it may be desirable to receive light from both sides of a device (e.g. a bifacial device), in which case a module may have transparent layers on both sides of the device.

"Encapsulant" layers are layers used to encase the fragile voltage-generating solar cell layer to protect it from damage and hold it in place in the photovoltaic module and are normally positioned between the solar cell layer and the incident layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, and other rigid polymeric sheets and cell surfaces, and good long term weatherability.

An "integrated frontsheet" is a sheet, layer or film that combines an incident layer and an encapsulant layer. An "integrated backsheet" is a sheet, layer or film that combines a backing layer and an encapsulant layer.

The terms "transparency" and "transparent" as used herein refer to the amount of light that can pass through or be transmitted through a material, compared to the light transmitted through air. "Light transmission level" as used herein is the percentage of light transmitted through a material compared to that transmitted through air.

Increased light transmission for front sheet constructions is desirable for increasing the amount of incident sunlight that reaches the solar cell layer. This enables improved efficiency of photovoltaic modules by allowing more solar energy to be available for conversion to electrical energy by the solar cells.

The term "copolymer" is used herein to refer to polymers containing copolymerized units of two different monomers (i.e. a dipolymer), or more than two different monomers.

The present invention is directed to improved fluoropolymer film laminates that have excellent transparency (i.e. light transmission) and adhesion and that exhibit physical property advantages compared to ETFE film laminates currently used in photovoltaic module applications.

Alternatives to ETFE films that exhibit higher transparency and/or better barrier properties are desirable, particularly for use in flexible solar cell modules where the use of rigid glass is not feasible. One alternative is a film made from a perfluorinated copolymer resin such as a tetrafluoroethylene-hexafluoropropylene copolymer (FEP). However, adhesion of FEP to common materials used in encapsulant layers of photovoltaic modules is significantly poorer than adhesion of ETFE to such materials. Thus, it would be desirable to find methods for preparing multilayer films and integrated front sheets for photovoltaic modules that provide improved adhesion between a perfluorinated copolymer resin layer and encapsulant materials, particularly under adverse conditions.

The process of the present invention is directed to a method for providing a transparent multilayer polymeric film laminate that is particularly suited for use in photovoltaic modules. The laminate comprises a film layer that consists essentially of a perfluorinated copolymer resin. This film layer is adhered to a second film layer that has been surface-treated with a particular type of coupling agent to promote adhesion.

The laminate is characterized by having an average peel strength between the first film layer and the second surface-treated film layer of greater than 2 lbf/in, measured after exposing the multilayer film laminate to conditions of 85° C. and 85% relative humidity for 1000 hours. It also is characterized by having a light transmission level that exceeds that of a comparison standard laminate wherein an ethylene tetrafluoroethylene copolymer resin layer replaces the FEP layer in the multilayer film laminate.

The unique combination of the specific perfluorinated copolymer resin and surface-treating agent provides substantially enhanced transparency and adhesion properties in the resultant film laminate, making it suitable for use in photovoltaic modules.

Briefly, the method for preparation of the transparent multilayer film laminate comprises the steps of providing a surface-modified first film layer that comprises a perfluorinated copolymer resin that consists essentially of copolymerized perfluorinated comonomer units, providing a second polymeric film layer, surface-treating the second polymeric film layer with an aminosilane coupling agent and adhering the layers to form a multilayer film laminate.

The first film layer of the multilayer film laminate prepared by the process of the invention comprises a fluorinated copolymer resin. The fluorinated copolymer resin component consists essentially of a perfluorinated copolymer. That is, the copolymer consists essentially of copolymerized monomer units wherein each monomer unit is a perfluorinated monomer. Suitable fluorinated copolymer resin components of the first film layer are tetrafluoroethylene (TFE) copolymers. That is, the polymer component will contain copolymerized units of 1) tetrafluoroethylene and 2) an additional monomer or monomers that are selected from perfluorinated comonomers other than tetrafluoroethylene.

By perfluorinated comonomer (or comonomers) it is meant that all monovalent atoms that are bonded to the carbon atoms of the particular monomer are fluorine atoms. Examples of perfluorinated (co)monomers include perfluoroolefins having 3 to 8 carbon atoms, such as hexafluoropropylene (HFP). Also suitable for use in the process of the invention are perfluorinated ether monomers, such as perfluoro(alkyl vinyl ethers) (PAVE) in which the linear or branched alkyl groups contain 1 to 5 carbon atoms. Preferred PAVE monomers are those in which the alkyl group contains 1, 2, 3 or 4 carbon atoms, respectively known as perfluoro(methyl vinyl ether) (PMVE), perfluoro(ethyl vinyl ether) (PEVE), perfluoro(propyl vinyl ether) (PPVE), and perfluoro(butyl vinyl ether) (PBVE).

The fluorinated copolymer resin component may be a perfluorinated dipolymer resin, such as a copolymer of TFE and HFP. It may also be a higher order copolymer, such as a terpolymer of TFE and two PAVE, for example. Commercially available perfluorinated copolymer resins of this latter type include TFE/perfluoro(methyl vinyl ether)/perfluoro(propyl vinyl ether) copolymer, sometimes referred to in the art as MFA. TFE/PAVE copolymers are most commonly referred to as PFA. They typically contain at least about 1 weight % copolymerized PAVE units. This includes those copolymers where the PAVE is PPVE or PEVE. Such copolymers will typically contain about 1 to 15 weight % copolymerized PAVE units. When a mixture of PAVE is used that includes PMVE and PPVE, the perfluorinated copolymer resin generally contains about 0.5 to 13 weight % copolymerized perfluoro(methyl vinyl ether) units and about 0.5 to 3 weight % copolymerized PPVE units, the remainder being TFE and bringing the total amount of copolymerized units to 100 weight %.

The perfluorinated copolymer resin of the first film layer consists essentially of a perfluorinated copolymer. That is, the copolymer may contain small percentages of copolymerized units of non-perfluorinated or non-fluorinated comonomers or non-perfluorinated or non-fluorinated end groups, generally below 3 weight percent, preferably below 1 weight percent, and most preferably below 0.5 weight percent, so long as the basic and novel characteristics of the multilayer film laminate formed by the process of the invention are not materially affected. These basic and novel characteristics include transparency and adhesivity, more fully described herein. In addition, if non-fluorinated monomers are present as copolymerized units, the amount of such monomers should be limited so that the copolymer retains desirable perfluoropolymer properties, i.e., weather resistance, solvent resistance and barrier properties. In certain embodiments, the perfluorinated copolymer resin is a copolymer of fluoroolefins and fluorinated vinyl ethers. Atoms other than fluorine and carbon may be present in the copolymer end groups, i.e. the groups that terminate the polymer chains.

The perfluorinated copolymer resins used herein are those that are melt-fabricable, i.e. when in the molten state they flow to an extent such that they can be fabricated by melt processing such as extrusion, to produce products having sufficient strength so as to be useful. The melt flow rate (MFR) of the perfluorinated copolymer resins is preferably at least about 5 g/10 minutes, more preferably at least about 10 g/10 minutes, still more preferably at least about 15 g/10 minutes, even more preferably at least about 20 g/10 minutes, and most preferably, at least 26 g/10 minutes, as measured according to ASTM D-1238 at the temperature and load which are standard for the resin (see for example ASTM D 2116-91a and ASTM D 3307-93).

Tetrafluorethylene-hexafluoropropylene copolymers (FEP) are preferred perfluorinated copolymer resins. The term "FEP copolymers" refers to copolymerized comonomers of tetrafluoroethylene (TFE) and hexafluoropropylene (HFP), optionally with any number of additional monomer units so as to form dipolymers, terpolymers, tetrapolymers and higher order copolymers.

In such copolymers, the copolymerized HFP content is typically about 6-17 wt %, preferably 9-17 wt % (calculated by multiplying HFPI by 3.2). HFPI (HFP Index) is the ratio of infrared radiation (IR) absorbances at specified IR wavelengths as disclosed in U.S. Statutory Invention Registration H130. Preferably, the TFE/HFP copolymer includes a small amount of additional comonomer to improve properties. The FEP copolymer can be TFE/HFP/perfluoro(alkyl vinyl ether) (PAVE), wherein the alkyl group contains 1 to 4 carbon atoms such as PEVE or PPVE. A preferred TFE/HFP copolymer is TFE/HFP/PAVE such as PEVE or PPVE, wherein the HFP content is about 6-17 wt %, preferably 9-17 wt % and the PAVE content, preferably PEVE, is about 0.2 to 3 wt %, the remainder being TFE to total 100 wt % of the copolymer.

Examples of useful FEP compositions are disclosed in U.S. Pat. Nos. 4,029,868; 5,677,404; and 6,541,588; US Patent Application Publication 2007/292685 and in US Statutory Invention Registration H130. The FEP may be partially crystalline. That is, it is not an elastomer. By partially crystalline is meant that the polymers have some crystallinity and are characterized by a detectable melting point measured according to ASTM D 3418, and a melting endotherm of at least about 3 J/g.

Of note are terpolymers containing copolymerized units of HFP (about 6 to 10 weight %), less than 2 weight % copolymerized units of perfluoroethylvinylether PEVE (about 1.5 to 2 weight %), the remainder being copolymerized units of TFE. One example is a perfluorinated copolymer having 7.2 to 8.1 weight % copolymerized units of HFP, 1.5 to 1.8 weight % copolymerized units of PEVE and 90.1 to 91.3 weight % copolymerized units of TFE, the copolymer having a nominal melt flow rate (MFR) of 6 to 8 gm/10 min as defined in ASTM D2116 and melting point 260° C. to 270° C.

The first film layer of the multilayer film laminate useful in the process of the invention comprises the perfluorinated copolymer resin. The first film layer may also include other components that do not adversely affect transparency and adhesion of the copolymer resin. For example, additives such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers may be present in the first film layer. Generally, such additives may be present in amounts of up to 20 weight percent of the first film layer composition, based on the weight of the total composition of the first film layer. In many embodiments, no more than 10 weight percent additives are present. In other embodiments less than 2 weight percent additives are present.

Transparent perfluorinated copolymer film layers suitable for use in the process of the invention may be formed by any technique known to those skilled in the art. For example, the films may be extrusion cast and optionally stretched and heat stabilized. Desirably, the perfluorinated copolymer resin film is oriented to provide improved properties, such as improved toughness and tensile strength.

The transparent perfluorinated copolymer resin film can have a thickness in the range of about 25 to 200 microns, or about 50 to 150 microns, or about 50 to 125 microns and a transmission of greater than about 90%, or greater than about 94%, or greater than about 97% in the visible region of the electromagnetic spectrum, where the visible region of the electromagnetic spectrum is defined as from 380 to 780 nm. High transparency may also be observed in regions of the electromagnetic spectrum beyond the visible region such as between 350 to 800 nm or higher.

The transparent perfluorinated copolymer resin films suitable for use in the process of the invention are those that have been subjected to a surface treatment. This surface treatment modifies the surface of the film and may take any form known within the art, including flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, chemical treatments, chromic acid treatments, hot air treatments, ozone treatments, ultraviolet light treatments, sand blast treatments, solvent treatments, and combinations of two or more thereof. A notable surface treatment is corona treatment (see, e.g., U.S. Pat. Nos. 3,030,290; 3,676,181; 6,726,979 and 6,972,068). Corona treatment can include use of reactive hydrocarbon vapors or other vapors such as ketones, for example, acetone and methyl vinyl ketone; alcohols, for example, methyl alcohol; p-chlorostyrene; acrylonitrile; anhydrous ammonia; amines, for example, propylene diamine, tetraethylene pentamine, cyclohexyl amine, decyl amine, diethylene triamine, tertiary butylamine, ethylene diamine, triethylene tetra-amine, triethylamine, and methylisopropyl amine; styrene sulfonic acid; carbon tetrachloride; tetraisopropyl titanate; tetrahydrofuran; toluene-2,4-diisocyanate; glycidyl methacrylate; hexane, methyl alcohol, vinyl acetate, vinyl butyl ether, methyl methacrylate, 2-vinyl pyrrolidone, xylene or mixtures thereof.

When the film is surface-treated, the resulting chemical or physical modification of the perfluorinated copolymer resin or of the film surface provides a modified first film layer surface. The modified perfluorinated copolymer surface makes it more amenable to further treatment, for example, providing improved adhesion to other materials. Without being tied to any specific mechanism or theory, the surface treatment may create polar functionalization and/or increased surface energy of the surface.

FEP films surface-treated as described above, such as the grade designated PV3151 commercially available from E.I. du Pont de Nemours and Company, are suitable for use in this invention.

The second film layer that is used to form the transparent multilayer film laminate prepared by the process of the invention may be selected from a variety of polymeric materials. Because the transparent multilayer film laminate is suitable for use as an integrated front sheet for a photovoltaic module, the second film layer is preferably able to function as an encapsulant layer. Accordingly, the second film layer and any optional additional encapsulant layers used in preparing transparent multilayer film and photovoltaic modules described herein may each comprise a polymeric material independently selected from the group consisting of olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and ethylenically unsaturated carboxylic acid esters (e.g., ethylene methyl acrylate copolymers, ethylene butyl acrylate copolymers, and ethylene maleic acid monoester copolymers, for example ethylene monoethyl hydrogen maleate), silicone elastomers, epoxy resins, and combinations of two or more thereof. The polymeric materials used in the second film layer may be the same as, or different from, the polymeric material used in any optional additional encapsulant layer that may be present in the transparent multilayer film laminates.

The second film layer and/or any optional additional encapsulant layer may preferably comprise a thermoplastic polymer selected from the group consisting of olefin α,β-unsaturated carboxylic acid copolymers, ionomers of olefin α,β-unsaturated carboxylic acid copolymers, and combinations thereof (i.e. a combination of two or more olefin α,β-unsaturated carboxylic acid copolymers, a combination of two or more ionomers of olefin α,β-unsaturated carboxylic acid copolymers, or a combination of at least one α,β-unsaturated carboxylic acid copolymer with one or more ionomers of α,β-unsaturated carboxylic acid copolymers).

The olefin α,β-unsaturated carboxylic acid copolymers used herein may be copolymers of an α-olefin having 2 to 10 carbons and an α,β-ethylenically unsaturated carboxylic acid having 3 to 8 carbons. For example, the acid copolymer may comprise about 15 to about 30 weight % of copolymerized units of the α,β-ethylenically unsaturated carboxylic acid, based on the total weight of the copolymer.

Suitable α-olefin comonomers include, but are not limited to, ethylene, propylene, 1-butene, 1-pentene, 1-hexene, 1-heptene, 3-methyl-1-butene, 4-methyl-1-pentene, and the like and combinations of two or more of such comonomers. Preferably, the α-olefin is ethylene.

Suitable ethylenically unsaturated carboxylic acid comonomers include, but are not limited to, acrylic acids, methacrylic acids, itaconic acids, maleic acids, fumaric acids, monomethyl maleates, and combinations of two or more thereof. Preferably, α,β-ethylenically unsaturated carboxylic acids are selected from the group consisting of acrylic acids, methacrylic acids, and combinations of two or more thereof.

In certain embodiments, the acid copolymers will not comprise comonomers other than the α-olefins and the α,β-ethylenically unsaturated carboxylic acids. As such, the copolymers may be dipolymers of the acid copolymer comprising about 15 to about 30 weight % of copolymerized units of the α,β-ethylenically unsaturated carboxylic acid, based on the total weight of the copolymer, the remainder being an α-olefin, preferably ethylene.

Alternatively, the acid copolymers may further comprise copolymerized units of other comonomer(s) in addition to the ethylenically unsaturated carboxylic acid and the α-olefin, such as derivatives of unsaturated carboxylic acids having 2 to 10, or preferably 3 to 8 carbons. Suitable acid derivatives include acid anhydrides (such as maleic anhydride), amides, and esters. Preferably, the acid derivatives are esters. Specific examples of esters of unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly(ethylene glycol) 4-nonylphenyl ether methacrylates, poly(ethylene glycol) phenyl ether acrylates, poly(ethylene glycol) phenyl ether methacrylates, dimethyl maleates, diethyl maleates, dibutyl maleates, dimethyl fumarates, diethyl fumarates, dibutyl fumarates, dimethyl fumarates, vinyl acetates, vinyl propionates, and combinations of two or more thereof.

Ionomers of acid copolymers are ionic, neutralized derivatives of precursor acid copolymers, such as those acid copolymers disclosed above. Ionomers of unsaturated carboxylic acid copolymers may be produced by neutralizing the acid groups of the precursor acid copolymers with a reactant that is a source of metal ions in an amount such that neutralization of about 10% to about 60%, or about 20% to about 55%, or about 35% to about 50% of the carboxylic acid groups takes place, based on the total carboxylic acid content of the precursor unsaturated carboxylic acid copolymers as calculated or measured for the non-neutralized precursor acid copolymers. Neutralization may often be accomplished by reaction of the precursor acid polymer with a base, such as sodium hydroxide, potassium hydroxide, or zinc oxide.

The metal ions may be monovalent ions, divalent ions, trivalent ions, multivalent ions, or combinations of two or more thereof. Useful monovalent metallic ions include but are not limited to sodium, potassium, and lithium. Useful divalent metallic ions include but are not limited to beryllium, magnesium, calcium, strontium, barium, copper, iron, cobalt, and zinc. Useful trivalent metallic ions include but are not limited to aluminum, scandium, iron, and yttrium. Useful multivalent metallic ions include but are not limited to titanium, zirconium, hafnium, vanadium, tantalum, tungsten, cerium, and iron. When the metallic ion is multivalent, complexing agents such as stearate, oleate, salicylate, and phenolate radicals may be included, as disclosed in U.S. Pat. No. 3,404,134. Preferably, the metal ions are monovalent or divalent metal ions, such as metal ions selected from the group consisting of sodium, lithium, magnesium, zinc, potassium and combinations of two or more thereof. Notably, the metal ions are selected from sodium, zinc, and combinations thereof, for example, the metal ion is zinc.

Ionomers useful herein include those available from E.I. du Pont de Nemours and Company, Wilmington Del., for example Surlyn® resins.

The composition of the second film layer and/or any optional additional encapsulant layer may comprise an ethylene/vinyl acetate copolymer comprising copolymerized units of ethylene and vinyl acetate. These copolymers may comprise 25 to 35, preferably 28 to 33, weight of vinyl acetate. The ethylene/vinyl acetate copolymer may have MFR of about 0.1 to about 1000 g/10 minutes, or about 0.3 to about 30 g/10 minutes, as determined in accordance with ASTM D1238 at 190° C. and 2.16 kg.

The ethylene vinyl acetate copolymer used in the second film layer and/or the additional encapsulant layer composition may be in the form of a single ethylene/vinyl acetate copolymer or a mixture of two or more different ethylene/vinyl acetate copolymers. By different ethylene/vinyl acetate copolymers is meant, for example, that the copolymers have different comonomer ratios. They may also be copolymers that have the same comonomer ratios, but different MFR due to having different molecular weight distributions.

Ethylene/vinyl acetate copolymers useful herein include Elvax® resins available from E.I. du Pont de Nemours and Company.

Alternatively, the second film layer and/or the additional encapsulant layer may comprise an ethylene/alkyl acrylate copolymer comprising copolymerized units of ethylene and an alkyl acrylate. The alkyl moiety of the alkyl acrylate may contain 1 to 6 or 1 to 4 carbon atoms, such as methyl, ethyl, and branched or unbranched propyl, butyl, pentyl, and hexyl groups. Exemplary alkyl acrylates include, but are not limited to, methyl acrylate, ethyl acrylate, iso-butyl acrylate, and n-butyl acrylate. The polarity of the alkyl acrylate comonomer may be manipulated by changing the relative amount and identity of the alkyl group present in the comonomer. Similarly, a $C_1$-$C_6$ alkyl methacrylate comonomer may be used as a comonomer. Such comonomers include methyl methacrylate, ethyl methacrylate, i-butyl methacrylate, and n-butyl methacrylate.

These copolymers may comprise 20 to 40, preferably 24 to 35, weight % of alkyl acrylate.

The ethylene/alkyl acrylate copolymers and ethylene/alkyl methacrylate copolymers useful herein may have MFR ranging from about 0.1 to about 200 g/10 minutes, as determined in accordance with ASTM D1238 at 190° C. and 2.16 kg, and therefore suitable ethylene/alkyl acrylate copolymers and ethylene/alkyl methacrylate copolymers can vary significantly in molecular weight.

The copolymer used in the second film layer composition of the multilayer film and/or any additional optional encapsulant layer composition may be in the form of a single ethylene/alkyl acrylate copolymer, a single ethylene/alkyl methacrylate copolymer, or a mixture of any two or more different ethylene/alkyl acrylate copolymers and/or ethylene alkyl methacrylate copolymers. Blends of at least one ethylene/alkyl acrylate copolymer and at least one ethylene/alkyl methacrylate copolymer are also contemplated as useful in the practice of the invention.

The ethylene/alkyl acrylate copolymers and/or ethylene/alkyl methacrylate copolymers may be prepared by processes well known in the polymer art using either autoclave or tubular reactors. For example, the copolymerization can be conducted as a continuous process in an autoclave, where ethylene, the alkyl acrylate (or alkyl methacrylate), and optionally a solvent such as methanol (see U.S. Pat. No. 5,028,674) are fed continuously into a stirred autoclave such as the type disclosed in U.S. Pat. No. 2,897,183, together with an initiator. Alternatively, the ethylene/alkyl acrylate copolymer (or ethylene/alkyl methacrylate copolymer) may be prepared in a tubular reactor, according to the procedure described in the article "High Flexibility EMA Made from High Pressure Tubular Process" (Annual Technical Conference—Society of Plastics Engineers (2002), 60th (Vol. 2), 1832-1836). The ethylene/alkyl acrylate copolymer (or ethylene/alkyl methacrylate copolymer) also may be obtained in a high pressure, tubular reactor at elevated temperature with additional introduction of reactant comonomer along the tube. The ethylene/alkyl acrylate copolymer or ethylene/alkyl methacrylate copolymer also may be produced in a series of autoclave reactors wherein comonomer replacement is achieved by multiple zone introduction of reactant comonomer as taught in U.S. Pat. Nos. 3,350,372; 3,756,996; and 5,532,066.

Ethylene/alkyl acrylate copolymers useful herein include Elvaloy® AC resins, available from DuPont.

The compositions used in the second film layer or any optional additional encapsulant layer can also include copolymers that comprise copolymerized units of ethylene and from about 5 to about 15% by weight of monoesters of $C_4$-$C_8$ unsaturated acids having at least two carboxylic acid groups (e.g. those diacids wherein one carboxyl group is esterified and the other is a carboxylic acid group) such as ethylene maleic acid monoester copolymers. Preferably, the monoester comprises about 6 weight % to about 15 weight % of the random copolymerized units of the copolymer chain.

Examples of useful monoester comonomers include maleic acid monoesters, fumaric acid monoesters, citraconic acid monoesters and mixtures thereof. Maleic acid monoesters are also known as maleic half-esters or alkyl hydrogen maleates.

Copolymers of ethylene and maleic acid monoesters, more preferably maleic acid $C_1$-$C_4$ alkyl monoesters such as, for example, methyl, ethyl, n-propyl, isopropyl, and n-butyl monoesters are highly preferred, and copolymers of ethylene and maleic acid monoethyl ester (i.e. ethyl hydrogen maleate) are most preferred.

Also suitable for use in the second film layer and/or optional encapsulant layer are terpolymers comprising copolymerized units of ethylene; copolymerized units of a first polar comonomer selected from the group consisting of $C_1$-$C_4$ alkyl monoesters of maleic acid; and copolymerized units of a second polar comononer selected from the group consisting of vinyl acetate, $C_1$-$C_4$ alkyl acrylates and $C_1$-$C_4$ alkyl methacrylates. Preferred terpolymers include those having less than 10 weight % copolymerized units of the second polar comonomer, based on the weight of the terpolymer. Preferably, less than 5 weight copolymerized units of the second polar comonomer will be present, based on the weight of the terpolymer. Preferred monomers suitable for use as the second polar comonomer in the above-described terpolymer are acrylic acid esters and methacrylic acid esters of $C_1$ to $C_4$ alcohols. Methyl acrylate and butyl acrylate are particularly preferred examples of the second comonomer.

These ethylene dicarboxylic acid monoester copolymers are obtained by a process of high-pressure free radical polymerization. They are direct or random copolymers, that is, copolymers polymerized by adding all monomers simultaneously. A high-pressure process suitable for preparing such copolymers is described, for example, in U.S. Pat. No. 4,351,931. This process provides mixtures of comonomers that react with each other to form the polymer chain to provide random copolymers having copolymerized units of all comonomers incorporated into the polymer backbone or chain.

The composition used in the second film layer and/or any additional optional encapsulant layer may further contain one or more additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), silane coupling agents (described in greater detail below), dispersants, surfactants, chelating agents, coupling agents, reinforcement additives (e.g., glass fiber), and fillers. Ethylene vinyl acetate copolymer compositions also frequently contain crosslinking agents such as organic peroxides. Any of these additives are generally present in amounts of no more than 20 weight % of the composition, sometimes no more than 10 weight % and sometimes no more than 2 weight %.

The method for preparing multilayer films described herein involves treating the surface of the second film layer of the multilayer film with an aminosilane coupling agent to improve adhesion of the composition of the second film layer to the perfluorinated copolymer resin film. A silane coupling agent is a silicon-based compound that contains two types of reactive sites in the same molecule, i.e. an inorganic and an organic site. Silane coupling agents can act as an interface between two dissimilar materials to improve bonding of the materials. It is known to add silanes to many sheet formulations, either as additives, copolymers or grafts. For many applications this is adequate but for adhesion to perfluorinated copolymer resins addition of the silane to the perfluorinated copolymer is not adequate to enhance adhesion.

Organosilane coupling agents contain at least one carbon-silicon bond. Typically, the silicon atom is bonded to three hydrolysable groups, such as methoxy-, ethoxy-, chloro-, or acetoxy-, and an organoreactive group. Without being bound by any theory, the silane may bond to reactive moieties on the surface of the perfluorinated copolymer resin film layer used in the process of the invention through reaction or interaction of the hydrolysable groups. Thus, reaction with the polymer or physical entanglement with the polymer or other organic material via the organoreactive groups on the organosilane may occur.

Examples of organoreactive groups present in organosilane coupling agents include amino, benzylamino, methacrylate, vinylbenzylamino, epoxy, chloropropyl, melamine, vinyl, ureido, mercapto, disulfide, and tetrasulfido groups. An organosilane coupling agent can include a single type of organoreactive group, a mixture of two or more groups of the same type, a mixture of two or more different types of groups, or a combination thereof.

Examples of aminosilanes that are useful as coupling agents in the process of the invention include 3-aminopropyltrimethoxysilane (APTMS), gamma-aminopropyltriethoxysilane (APTES), N,N'-bis[(3-trimethoxysilyl)propyl]ethylenediamine (dipodalAP), N-(2-aminoethyl)-3-aminopropyltrimethoxysilane (AEAPTMS), and N-2-(vinylbenzylamino)-ethyl-aminopropyltrimethoxysilane (SMAEAPTMS), notably APTMS, APTES and AEAPTMS.

Organosilane coupling agents have been used in the past to improve adhesion between compositions used as encapsulant materials and various materials used in incident layers of photovoltaic modules. For example, ethylene/vinyl acetate (EVA) copolymer compositions used in photovoltaic module encapsulant layers generally include an organosilane coupling agent such as γ-methacryloxypropyltrimethoxysilane to facilitate bonding to other materials. See "Adhesion Strength Study of EVA Encapsulants on Glass Substrates" F. J. Pern and S. H. Glick, NCPV and Solar Program Review Meeting 2003 NREL/CD-520-33586, Page 942.

However, previous organosilane-modified encapsulants have not provided sufficient adhesion to perfluorinated copolymer resins such as tetrafluoroethylene-hexafluoropropylene (FEP) to provide robust photovoltaic cells. Furthermore, some organosilane coupling agents, such as certain aminosilane coupling agents (having at least one amine functional group) cannot be mixed into, i.e. incorporated into, ethylene α,β-unsaturated carboxylic acid copolymers and ionomer encapsulant materials because the resulting compositions have unacceptable levels of gel formation when formed into films.

Surprisingly however, it has been found that aminosilane coupling agents are useful as surface treatment agents to improve the adhesion of encapsulant materials, including such materials as ethylene acid copolymers, ionomers, ethylene alkyl acrylate copolymers, ethylene alkyl methacrylate copolymers and ethylene vinyl acetate copolymers, to perfluorinated copolymer resins such as FEP. Using the method described herein, a transparent film having a surface-modified perfluorinated copolymer resin layer can be directly laminated to a surface of a second film layer that has been previously surface-treated with an aminosilane coupling agent to form a weatherable multilayer film laminate that has an unusual combination of high adhesivity and excellent transparency. A weatherable multilayer film is a film in which the individual layers are well adhered to each other, such that the peel strength between the layers is greater than 2 lbf/in after exposure to 1000 hours of damp heat (85° C./85% relative humidity) as described in the test methods below.

In addition, it has been found that when the aminosilane-treated film materials described above are adhered to films of surface-modified perfluorinated copolymer resins, transparency is improved compared to similarly-constructed laminates that contain films comprising non-perfluorinated copolymer resins, such as corona-treated ETFE, specifically ETFE that has been corona-treated on one side, such as the film designated PV3251 available from E.I. du Pont de Nemours and Company This property relates to solar radiation transmittance. Multilayer films prepared by the process of the invention are characterized by having a percentage solar radiation transmittance at wavelengths from 400 to 800 nm, as determined according to ASTM E424, that exceeds that of a comparison standard laminate wherein the comparison standard laminate has a first layer that comprises an ethylene tetrafluoroethylene copolymer resin (ETFE). Thus, when a multilayer film laminate construction is prepared according to the process of the invention and the first film layer is a surface-modified perfluorinated copolymer resin, the percentage solar radiation transmittance as determined according to ASTM E424 of the laminate exceeds that of an otherwise identical comparison standard multilayer film laminate construction where the fluoropolymer component of the first film layer is corona-treated ETFE, the multilayer film laminates otherwise being identical in chemical composition and laminate structure, including film layer thickness.

In the method of the invention, the surface of a layer of a polymeric material, for example an encapsulant composition, such as a composition containing an ethylene unsaturated carboxylic acid copolymer or ionomer thereof in the form of a film or sheet, is treated with an aminosilane coupling agent.

The aminosilane coupling agent may be applied to the surface of the second film layer using any known technique including liquid phase techniques (e.g., dip coating, spray coating, etc.) and gas phase (e.g., vapor deposition) techniques. Preferably, the aminosilane coupling agent may be applied as a liquid solution, generally a solution wherein the concentration of aminosilane is from 0.05 to 1% by weight. The aminosilane may be dissolved in a solution including a polar organic solvent and applied to a film using a dip coating technique, followed by drying to remove the solvent. The drying may occur at an elevated temperature, sufficient to drive off the liquid solvent. The polar organic solvent may be a low molecular weight alcohol, such as those having 8 or fewer, preferably 4 or fewer, carbon atoms, (e.g., methanol, ethanol, propanol, or isopropanol). The solution may include a mixture of a polar organic solvent and water. For example, a 0.1 weight % aminosilane solution may be applied using a solution of 95% ethanol in water, and then dried at a temperature of 100° C. A range of solution compositions and drying temperatures can be used, and the composition and drying temperature will depend on the particular aminosilane used in combination with the solvent chosen, as well as the surface characteristics of the second film layer and the perfluorinated copolymer resin film layer to which the second film layer will be adhered.

One can also appreciate that the aminosilane coupling agent may be applied to the surface of one side of the second film layer, or it may be applied to the surfaces of both sides of the second film layer to facilitate bonding to the perfluorinated copolymer resin film on one side and an additional layer on the other side. Of note are films that comprise ethylene α,β-unsaturated carboxylic acid copolymers, ionomers thereof, ethylene alkyl acrylate copolymers, ethylene alkyl methacrylate copolymers or ethylene vinyl acetate copolymers that are surface-treated (on one side or on both sides) with an aminosilane coupling agent.

Although the entire surface area of the film may be treated, the surface treatment need not provide a continuous and/or uniform coating of aminosilane on the surface of the second film layer, but sufficient aminosilane should be applied in order to significantly increase adhesion to a perfluorinated copolymer resin film, for example a FEP film. Too great an amount of aminosilane coupling agent may not provide increased adhesion between the perfluorinated copolymer resin film layer and the second film layer because the aminosilane may self-condense to form a weak, brittle siloxane network on the surface of the film layer. This siloxane network can fail cohesively, resulting in interlayer separation.

Without being bound by any particular theory, a layer of aminosilane one molecule thick evenly spread across the surface of the second film layer would provide optimum adhesion. However, due to microscopic surface irregularities in the films to be adhered, the amount of aminosilane needed is likely to be somewhat higher.

When using solution coating techniques, the concentration of aminosilane in the solution is desirably from 0.01 to 1 weight %, preferably from 0.05 to 0.5 weight %.

If desired, the composition that forms the second film layer of the transparent multilayer film laminate formed by the process of the invention (and similarly any additional encapsulant layer that is present in the multilayer film laminate prepared by the process of the invention) may further comprise an incorporated organosilane coupling agent, provided that when the composition of either layer comprises an ethylene α,β-unsaturatedcarboxylic acid copolymer or ionomer of an ethylene α,β-unsaturatedcarboxylic acid copolymer, the incorporated organosilane coupling agent does not comprise an aminosilane. A silane coupling agent incorporated in any optional additional encapsulant layer may be the same as or different from the aminosilane coupling agent used to treat the surface of the second film layer. The second film layer of the multilayer film laminate prepared by the process of the invention will however always be surface-treated with an aminosilane.

In one step of the method of the invention, the treated surface of the second film layer is contacted with a surface of the first perfluorinated copolymer resin layer that has been surface-modified. Contact is made in such a manner that the perfluorinated copolymer resin layer and the second film layer are arranged in overlying fashion. The resulting multilayer film structure (prior to adhesion by heat and optional pressure or vacuum) or multilayer film laminate (after the layers are adhered by heat and optional pressure or vacuum), i.e. multilayer overlay, may be used in a subsequent lamination step.

In the process of the invention, the first surface-modified perfluorinated resin copolymer film layer and the surface-treated second film layer are adhered by the application of heat and optionally pressure or vacuum. Sufficient heat is applied to the multilayer film structure described above to reach a temperature above the softening temperature of the second film layer so that it softens and adheres to the first perfluorinated copolymer resin layer. This temperature will depend on the particular polymer or polymers that comprise the second film layer. In addition, one or more other layers may be in contact with one or more of the first and/or second film layers. However, there are no layers intervening between the first and second film layers. Depending on the equipment used, lamination conditions, number of other layers present, and the like, it may be necessary to maintain the temperature at 10° C. to 30° C. higher than the softening temperature of the second film layer for a period of one to 10 minutes to achieve adhesion. Optionally, pressure or vacuum can be applied to the multilayer film structure during heating to ensure good contact between the layers.

When the material used in the second film layer (i.e. an encapsulant material) does not require crosslinking for dimensional stability, it may be possible to prepare the multilayer film laminate by contacting the aminosilane surface-treated second film layer with the surface-modified first perfluorinated copolymer resin film layer to form a multilayer film structure, applying heat and passing the multilayer film structure through a nip. For example, the multilayer film structure may be heated in an oven at about 80° C. to about 120° C., or about 90° C. to about 100° C., for about 20 to about 40 minutes, and thereafter, the heated multilayer film structure is passed through a set of nip rolls so that the air in the void spaces between the individual layers may be squeezed out, and the edge of the multilayer film structure sealed. This forms a multilayer film laminate. The multilayer film laminate at this stage may be referred to as a pre-press. The multilayer film laminate, or pre-press, may then be placed in an air autoclave where the temperature is raised to about 120° C. to about 160° C., or about 135° C. to about 160° C., at a pressure of about 100 to about 300 psi (about 6.9 to about 20.7 bar), or about 200 psi (13.8 bar). These conditions are maintained for about 15 to about 60 minutes, or about 20 to about 50 minutes, after which the air is cooled while no more air is introduced to the autoclave. After about 20 to about 40 minutes of cooling, the excess air pressure is vented and the laminated products are removed from the autoclave.

The multilayer film laminates may also be produced through non-autoclave processes. Such non-autoclave processes are disclosed, for example, in U.S. Pat. Nos. 3,234,062; 3,852,136; 4,341,576; 4,385,951; 4,398,979; 5,536,347; 5,853,516; 6,342,116 and 5,415,909; and U.S. Patent Application Publication 2004/0182493, European Patent Application Publication 1235683 B1 and PCT International Publications WO9101880 and WO03057478. Generally, the non-autoclave processes include heating the pre-lamination assembly and the application of vacuum, pressure or both. For example, the assembly may be successively passed through heating ovens and nip rolls.

A vacuum laminator may be used to adhere the surface-modified perfluorinated copolymer resin first film layer to the surface-treated second film layer to provide a multilayer film laminate. The laminator comprises a platen base, on which the film layers are placed in overlying fashion for lamination. The laminator also comprises an enclosure that covers and completely surrounds the platen base. The region enclosed by the platen and enclosure may be evacuated. The laminator also comprises a flexible bladder within the enclosure attached to the top inner surface of the enclosure, which may be inflated to a pressure greater than the pressure in the evacuated region. For example, the pressure above the bladder may be atmospheric and the laminate may be held under vacuum beneath the bladder to remove air. When the bladder is inflated, the flexible surface of the bladder is pushed from the top of the enclosure toward the platen and applies a surface pressure to the multilayer overlay to ensure good thermal contact between the overlay and the platen. For lamination of the multilayer film structure, the laminator is preheated to a temperature above the softening temperature of the second film layer and held at that temperature throughout the lamination process.

A surface-modified surface of the perfluorinated copolymer resin first film layer is placed in contact with the aminosilane-treated surface of the second film layer such that the second film layer is sandwiched between the platen and the first film layer. Other layers may be placed between the second film layer and the platen for adhesion to the second film layer. Heat-resistant sheets may be placed under the second film layer to retard heat flow and allow deaeration and devolatilization of the sample. Release sheets may be placed under the second film layer and/over the first film layer to prevent the sample layers from adhering to parts of the laminator. The multilayer film structure is placed on the platen and the enclosure of the laminator is lowered into place and sealed. Next, the region surrounding the multilayer film structure between the platen and enclosure of the laminator is evacuated (e.g. to a pressure of 1 mbar) to help further with the prevention of voids, defects, and air pockets. Next, the rubber bladder is inflated (e.g. to a pressure of 999 mbar) so that it presses against the multilayer film structure and ensures good thermal contact with the platen. The pressure and heat are maintained for a sufficient period of time (for 1 to 10 minutes) to soften the second film layer and adhere it to the perfluorinated copolymer resin first film layer and, if present, any additional layer contacting the surface of the second film layer opposite the perfluorinated copolymer resin first film layer. If the second film layer comprises an ethylene vinyl acetate copolymer, heat and pressure are maintained for an additional period of time to allow for crosslinking as described below. When the heating step is complete, the bladder is depressurized to 0 mbar so that it may be removed from contact with the multilayer film laminate, the enclosure is vented to atmospheric pressure and the enclosure is unsealed and opened. The multilayer film laminate is removed from the platen and allowed to cool to room temperature.

To facilitate crosslinking, EVA compositions used herein are formulated with 0.1 to 5 parts per hundred of crosslinking agents such as organic peroxides. Crosslinking EVA may be conducted so that the internal temperature of the EVA layer(s) reaches temperatures from 120° C. to 170° C. or 180° C. for a time sufficient to provide a gel content of 65 to 90%, preferably 80 to 90%, or higher. Depending on the equipment, lamination conditions and number of other layers, it may be necessary to maintain the laminated multilayer structure at 10° C. to 30° C. higher than the desired internal temperature for a longer period of time to ensure that the desired internal conditions are met. For example, crosslinking may be conducted by maintaining the laminated multilayer structure at 150° C. for 10 to 20 minutes so that the internal temperature of the EVA reaches 140° C. for at least 5 minutes to obtain 80% gel content. The internal temperature of the EVA during the lamination/crosslinking may determined by placing a thermocouple sensor between the EVA and the underlying layer during the assembly of a test sample and then monitoring the temperature during the lamination process. As the EVA melts, the thermocouple is completely surrounded by the EVA. Crosslinking conditions may also be based on conditions previously known to provide sufficient crosslinking.

The lamination procedure described can be used to prepare multilayer films, particularly for second film layers other than formulated EVA.

The lamination methodology described herein is by no means the only possible way to carry out such laminations. For example, more advanced laminators have retractable pins that hold the multilayer laminate structure above the heat source until the desired time to effect contact and heating. This would obviate the need for heat resistant layers in most cases. With appropriate modifications, the lamination procedure can also be used to prepare photovoltaic modules including encapsulant layers, solar cell layers and/or backing layers as described below.

The weatherable multilayer film laminate may be used as an integrated frontsheet for a photovoltaic module that provides all the properties necessary to protect the electrical components of the photovoltaic module provided by separate incident and encapsulant layers and can be attached directly to the solar cell layer of the module. The transparent multilayer film laminate prepared herein may be used as an integrated frontsheet wherein the perfluorinated copolymer resin first film layer functions as the incident layer and the second film layer functions as an encapsulant layer.

Accordingly, the invention is directed to a method for forming a photovoltaic module that comprises the above-described method for preparing a transparent multilayer film laminate and also further comprises a step of overlaying a solar cell layer with the transparent multilayer film laminate (i.e. an integrated frontsheet) prepared by the process of the invention.

In one embodiment a solar cell layer is contacted with the transparent multilayer film laminate in a manner such that the surface of the aminosilane surface-treated second film layer that is opposite that which contacts the first perfluorinated copolymer resin layer contacts a solar cell layer. In this embodiment, the surface area of the multilayer film laminate is larger than that of the solar cell layer and some portions of the multilayer film laminate will extend beyond the perimeter of the solar cell layer. Additionally, in this embodiment, those portions of the transparent multilayer film laminate that extend beyond the perimeter of the solar cell layer are positioned so as to contact an encapsulant layer that may be formed of the same or different material as the second film layer of the transparent multilayer film laminate. The transparent multilayer film laminate is then adhered to the solar cell layer and the encapsulant layer by the application of heat and optionally pressure to form a photovoltaic module. When the second film layer of the transparent multilayer film laminate and/or the encapsulant layer comprise EVA, the process to prepare the photovoltaic module is conducted in a manner such that sufficient heat and pressure are applied to the layer structure comprising the transparent multilayer film laminate, solar cell layer and encapsulant layer for a time sufficient to crosslink the EVA composition or compositions.

The solar cell layer may be significantly thicker than the other layers and irregular in shape, including spaces between and around the solar cells and other components of the solar cell layer. Therefore, portions of the second film layer of the transparent multilayer film laminate will contact the encapsulant layer outside the perimeter of the solar cell layer and can be adhered when heat is applied. As used herein, the perimeter of the solar cell layer is the outline of the outer limits of the lateral area encompassed by the solar cell layer. The second film layer may also contact the additional encapsulant layer in the spaces between the solar cell layer components. In many cases, it is desirable that the second film layer and/or the encapsulant layer flow into the spaces and closely encapsulate the solar cells and other components to physically consolidate the photovoltaic module. Thus, it may be necessary to apply heat for a period of time sufficient to allow such flow, which may be longer than that needed for adhering thinner layers of a more regular shape. For example, heat may be applied in such a manner that the transparent multilayer film laminate is maintained above the softening point of the second film layer thereof or above the softening point of the additional encapsulant layer, whichever is higher, for 5 to 30 minutes to effectively consolidate the photovoltaic module.

The steps recited above may be accomplished using a vacuum lamination procedure similar to that described previously, with the modification that an encapsulant layer and a solar cell layer are included in a multilayer laminate structure with the transparent multilayer film structure that comprises the first perfluorinated copolymer resin film layer and the second film layer.

In many cases, photovoltaic modules may be prepared as described above, in which a transparent multilayer film laminate comprising a perfluorinated copolymer resin film layer and a second film layer is prepared (an integrated frontsheet), and subsequently assembled in combination with other layers into a photovoltaic module by application of heat and optionally pressure or vacuum.

Another embodiment includes treating the surface of the second film layer with an aminosilane coupling agent, contacting the aminosilane treated surface of the second film layer with a modified surface of a perfluorinated copolymer resin film layer to form a film laminate structure, overlaying a solar cell layer with the film laminate structure such that the second film layer is positioned such that portions of the second film layer contact an encapsulant layer and then applying heat and optionally pressure to adhere the various layers to each other simultaneously. This provides a process for preparation of the photovoltaic module wherein the lamination of all the layers is accomplished in a single operation.

The methods described above may also include those wherein an additional layer or layers are adhered to the surface of the encapsulant layer. In such embodiments, an additional layer is positioned on the side of the encapsulant layer opposite the surface that contacts portions of the surface of the second film layer. The additional layer may be adhered to the encapsulant layer prior to, simultaneously with, or subsequently to contacting and adhering the second film layer to the above-described encapsulant layer.

For example, the encapsulant layer may be part of an integrated backsheet in which the encapsulant layer is adhered to an additional layer prior to contacting and adhering to the second film layer. Alternatively, the encapsulant layer may be contacted with the second film layer of the transparent multilayer film laminate on one surface and another layer, such as a backsheet, on the opposite surface and adhered to both layers simultaneously, or the encapsulant layer may be adhered to the second film layer of the transparent multilayer film laminate and then adhered to another layer, such as a backsheet.

In some cases, the encapsulant layer may also be surface treated with an aminosilane coupling agent to improve adhesion to the second film layer and/or the additional layer.

In any of these cases, the second film layer of the transparent multilayer film laminate may be part of an integrated frontsheet in combination with the first perfluorinated copolymer resin film layer, or the first perfluorinated copolymer resin film layer and second film layer may adhered at the same time that the second film layer of the transparent multilayer film laminate is adhered to the solar cell layer and the encapsulant layer.

The methods described above provide multilayer films and photovoltaic modules characterized by an average peel strength between the first film layer and the second film layer of greater than 2 lbf/in, measured after exposing the film or photovoltaic module to conditions of 85° C. and 85% relative humidity (damp heat) for 1000 hours. When the film or photovoltaic module contains an EVA layer, the EVA is crosslinked prior to exposure to damp heat.

Photovoltaic modules, the solar cell layer and the additional layer or layers used in these methods are described in greater detail below.

In a typical module construction, the solar cell layer is sandwiched between two encapsulant layers, which are further sandwiched between the frontsheet (or incident layer) and backsheet layers, providing weather resistance, UV resistance, moisture barrier properties, low dielectric constant, and high break down voltage. In the methods described herein, a layer comprising a surface-modified perfluorinated copolymer resin film composition of a transparent multilayer film laminate serves as the frontsheet of a photovoltaic module and the second film layer of the transparent multilayer film laminate serves an encapsulant layer. The combination may be provided in the form of the transparent multilayer film laminate described herein, also known as an integrated front sheet. As previously described, the second film layer and an additional encapsulant layer sandwich the solar cell layer and another layer (a backsheet layer) may also be adhered to the additional encapsulant layer.

Monocrystalline silicon (c-Si), poly- or multi-crystalline silicon (poly-Si or mc-Si) and ribbon silicon are the materials used most commonly in forming traditional wafer-based solar cells. Photovoltaic modules derived from wafer-based solar cells often comprise a series of self-supporting wafers (or cells) that are soldered together. The wafers generally have a thickness of between about 180 and about 240 µm.

Thin film solar cells are commonly formed from materials that include amorphous silicon (a-Si), microcrystalline silicon (pc-Si), cadmium telluride (CdTe), copper indium selenide ($CuInSe_2$ or CIS), copper indium sulfide, copper indium/gallium diselenide ($CuIn_xGa_{(1-x)}Se_2$ or CIGS), copper indium/gallium disulfide, light absorbing dyes, and organic semiconductors. Thin film solar cells with a typical thickness of less than 2 µm are produced by depositing the semiconductor layers onto a superstrate or substrate formed of glass or a flexible film.

Photovoltaic modules prepared by the methods described herein include, but are not limited to, wafer-based solar modules (e.g., c-Si or mc-Si based solar cells, as described above) and thin film solar modules (e.g., a-Si, µ-Si, CdTe, CIS, CIGS, light absorbing dyes, or organic semiconductor based solar cells). Within the solar cell layer, the solar cells may be electrically interconnected and/or arranged in a flat plane. In addition, the solar cell layer may further comprise electrical wiring, such as cross ribbons and bus bars.

Suitable backsheet layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented. A multilayer film of polyester (PET) sandwiched between two layers of polyvinyl fluoride (PVF) is a specific example of a backsheet. Although a multilayer film comprising a perfluorinated copolymer film layer adhered to an aminosilane surface-treated second film layer prepared as described herein has been described above as an integrated frontsheet, it may alternatively be used as an integrated backsheet. When used as an integrated backsheet, such a transparent multilayer film laminate may be used in combination with a similar or identical transparent multilayer film laminate used as an integrated frontsheet or with frontsheets and/or encapsulant layers of different compositions.

In some embodiments, bifacial modules receive incident light from both sides of the device, incorporating a transparent layer on both front and back. For example, a transparent multilayer film laminate as described herein may be used as a first frontsheet of a bifacial device, while a glass layer is used as a second frontsheet. Alternatively for a flexible bifacial module, transparent multilayer film laminates as described herein may be used on both sides of the device, in which the compositions of each sheet may be the same or different. For example, an FEP transparent layer may be used as a frontsheet on one side of the device with an ETFE transparent layer of the prior art used on the other side of the device, or FEP layers may be used on both sides of the device.

The solar cell module may further comprise other functional film or sheet layers (e.g., dielectric layers or barrier layers) embedded within the module. For example, poly(ethylene terephthalate) films coated with a metal oxide coating, such as those disclosed in U.S. Pat. Nos. 6,521,825 and 6,818,819 and European Patent EP1182710, may function as oxygen and moisture barrier layers in the transparent multilayer film laminates or photovoltaic modules.

If desired, a layer of fiber (scrim) may also be included between the solar cell layers and encapsulant layers to facilitate deaeration during the lamination process or to serve as reinforcement for the encapsulant layers. The fiber may be a woven or nonwoven glass fiber or a networked mat of connected fibers. The use of such scrim layers is disclosed in, e.g., U.S. Pat. Nos. 5,583,057; 6,075,202; 6,204,443; 6,320,115; and 6,323,416 and European Patent EP0769818.

Any of the foregoing embodiments of photovoltaic modules may be prepared using the methods described herein.

The invention is further illustrated by the following examples, which do not limit the scope of the invention described in the claims.

EXAMPLES

Materials Used

ACR-1: An ethylene/methacrylic acid copolymer (19 weight copolymerized methacrylic acid units), melt flow rate 60 g/10 minutes, (190° C., 2.16 kg) as determined according to ASTM D1238.

Ionomer-1: An ethylene/methacrylic acid copolymer (19 weight copolymerized methacrylic acid units) neutralized with 3.2 weight % of ZnO, melt flow rate 1.3 g/10 minutes (190° C., 2.16 kg) as determined according to ASTM D1238.

Ionomer-2: a melt blended mixture of 77 parts of an ethylene/methacrylic acid copolymer (19 weight % copolymerized methacrylic acid units), 23 parts of Ionomer-1, and 10 parts of a masterbatch blend of 97.5 weight of Ionomer-1 and 2.5 weight % of Tinuvin® 328.

Ionomer-3: 90 parts of an ethylene/methacrylic acid copolymer (15 weight % copolymerized units of methacrylic acid), neutralized with 1.19 weight of ZnO, melt flow rate 5.5 g/10 minutes (190° C., 2.16 kg), as determined according to ASTM D1238, compounded with 10 parts of a stabilizer concentrate consisting of 8.6 parts of ACR-1, 0.4 parts of Tinuvin® 328, 0.3 parts of Irganox® 1076, 0.3 parts of Irgafos® 168 and 0.4 parts of Chimasorb® 2020.

APTMS: 3-aminopropyltrimethoxysilane, available from Sigma-Aldrich Co.

FEP-1: A film, corona treated on one side, comprising a tetrafluoroethylene-hexafluoropropylene copolymer (7.2 to 8.1 weight copolymerized units of HFP, 1.5 to 1.8 weight % copolymerized units of PEVE and 90.1 to 91.3 weight % copolymerized units of TFE), nominal melt flow rate 6 to 8 gm/10 minutes as defined in ASTM D2116 and melting between 260 and 270° C., designated as PV3151, available from DuPont.

ETFE-1: A film, corona treated on one side, comprising an ethylene-tetrafluoroethylene copolymer (76.5 to 80.1 weight % copolymerized units of TFE, 17.8 to 19.6 weight % copolymerized units ethylene and 2.1 to 3.9 weight % copolymerized units of PFBE), designated as PV3251, available from DuPont.

Films were prepared from Ionomer-2 and Ionomer-3 by conventional extrusion casting methods. Films were prepared from Ionomer-2 by feeding Ionomer-2 pellets to a 4½" single screw extruder. The melt was extruded at 320° F., filtered through a 250 mesh screen and fed to a 54-inch-wide sheet die maintained at 320° F. The polymer was extruded through the die and fed to a nip formed between a roughened steel roll and a roughened rubber roll to impart a random embossed surface pattern to the sheet. The 15 mil sheet was cooled and collected on a roll winder at approximately 10 ft/min. Films 15 mil thick were prepared from Ionomer-3 by extrusion at 150° C. set point (melt temperature 180° C.) using a 10-inch die with a 20 mil gap.

The ionomer-containing films were treated with aminosilane according to the following procedure, wherein all parts are by weight.

Surface Treatment Method

A solution was prepared from 95 parts ethanol, 5 parts of water and 0.1 parts of APTMS. The ethanol and water portions are available as a premixed solvent, "Ethanol for Molecular Biology, 190 Proof" from Sigma/Aldrich Co. Samples of the ionomer films were attached with metal paper clips to a PTFE (Teflon® fluoropolymer resin) plate substrate for support. The side of the film intended to be treated with aminosilane was oriented to face outward, away from the support plate. While the solution liquid could enter between the support plate and the film attached to it, so that both sides could be treated, there was free access of the solution liquid to the surface of the film facing away from the support. The film and supporting substrate assembly were immersed in the solution for five minutes. The film and supporting substrate were then removed from the solution and rinsed thoroughly with isopropyl alcohol. After rinsing was complete, the entire assembly was blown dry with a stream of nitrogen. To remove any remaining solvent, the assembly was placed in a convection oven set at 100° C. for 30 minutes. The clips could be removed from the assembly before placement in the oven to prevent permanently wrinkling the film due to the constraint maintained by the clips under thermal stresses. The dried film could be laminated to a substrate immediately following drying or stored for future laminating. When laminated, the surface of the film that had been facing away from the support was laminated.

Lamination Method

Commercially available films of FEP-1 and ETFE-1 were used as received from the manufacturer.

For adhesion strength testing, ionomer film samples were laminated to perfluorinated copolymer resin film and a foil substrate. The surface of the ionomer-containing film that faced away from the support in the surface treatment method was the surface that contacted the perfluorinated copolymer resin film.

A laminator with a platen, enclosure and bladder was used to laminate the films. Samples consisted of an aluminum foil substrate, a sample sheet, and a flexible top sheet. Example sample sheets were ionomer-containing sheets surface treated according to the Surface Treatment Method described above. The flexible top sheet was a surface-modified (i.e. corona-treated) perfluorinated copolymer resin film. Comparative Examples include similar laminated samples prepared using corona-treated ETFE-1 instead of FEP-1 and laminated samples prepared using ionomer films that were not surface treated.

The corona-treated surface of the perfluorinated copolymer resin film was placed in contact with the aminosilane-treated surface of the ionomer-containing film such that the ionomer-containing film was sandwiched between the foil and the perfluorinated copolymer resin film.

The laminated area of the samples was 8 inches by 8 inches. A small piece of polyester slip sheet was placed between the perfluorinated copolymer resin film and the ionomer-containing sample film at one end of the overlay to provide an unlaminated (unadhered) region to serve as an initiation point for subsequent peel tests. After assembling a test sample, it was placed with the foil backsheet atop an untreated 10 mil thick Teflon® FEP 1000A release film sheet and five heat resistant layers made of Sontara® Z-11 spunlaced fabric comprising Kevlar® aramid fibers (1.8-2.0 oz/yard, available from DuPont (Wilmington, Del.). Another 10 mil Teflon® FEP 1000A release sheet was placed atop the multilayer laminate structure test sample. The purpose of the heat resistant layers was to slow the heating rate during the lamination so that the sample layer was not softened before all the air could escape from between the film layer interfaces, thereby avoiding formation of air pockets and other defects. The release sheets prevented any material that might flow from the multilayer laminate structure from adhering to parts of the laminator.

The assembly consisting of multilayer film laminate, heat resistant layers and Teflon® FEP 1000A release sheets was then placed onto the platen with the foil facing the platen. The platen was preheated to a temperature of 150° C. and maintained at 150° C. throughout the lamination process. Immediately after placing the assembly on the platen, the enclosure of the laminator was lowered into place, sealed and the region surrounding the sample between the platen and enclosure of the laminator was evacuated over approximately six minutes to a pressure of 1 mbar to further assist in prevention of voids, defects, and air pockets. The rubber bladder was then inflated over a period of approximately one minute to a pressure of 999 mbar to provide pressure on the sample and other layers and ensure good thermal contact with the platen. The enclosure pressure (1 mbar), bladder pressure (999 mbar), and the temperature of the platen (150° C.) were held constant for approximately 13 minutes or longer, depending on the sample composition and number of heat resistant layers. The heating insured that the surface-treated ionomer film was softened so that it was in intimate conforming contact with the surface of the perfluorinated copolymer film.

Following the lamination period, the bladder was depressurized to 0 mbar (over 30 seconds). The enclosure was vented to atmospheric pressure and the enclosure was opened. This operation required approximately thirty seconds. The samples and other layers were immediately removed from the platen and allowed to cool at room temperature for at least 10 minutes.

Samples prepared for light transmission testing were similarly prepared using aminosilane surface-treated films, except that the opaque foil substrate was replaced with a Teflon® resin film that did not adhere to aminosilane-treated surface of the second layer of the sample. Sample size was 4 inches by four inches. Four sheets of Sontara® Z-11 spunlaced fabric were placed between the bottom platen and each sample to slow the heating rate. Samples were positioned fluoropolymer frontsheet down (toward the platen); removable (untreated) fluoropolymer backsheet up (toward the bladder). Glass plates above and below the sample were used to maintain flatness. The lamination was conducted using a 4-minute evacuation period, 1-minute pressurization period, and 30 minute hold period to accommodate heating of the glass plates.

Following the lamination step, the Teflon® film was easily removed to provide a transparent 2-layer laminate of the fluoropolymer frontsheet adhered to the surface-treated second film layer. Comparative Example multilayer film laminates were prepared using ETFE-1 instead of FEP-1 as the fluoropolymer film layer.

Test Methods

Damp Heat Exposure

Multilayer film laminate samples were placed, suspended vertically from a shelf by clips, in a laboratory oven capable of providing controlled heat and humidity. The oven was then brought to a temperature of 85° C. and relative humidity of 85%. For the test duration, the oven was kept "dark" (i.e. no internal illumination sources were used; some light may have entered through the observation window from the exterior of the oven). These conditions were maintained for a specified number of hours. Samples were removed and tested after exposures of 500 hours and 1000 hours to estimate suitability for use in photovoltaic applications. Conditions of 1000 hours at 85° C. and 85% relative humidity are the required exposure conditions in many photovoltaic module qualification standards.

Peel Strength

Samples were prepared by passing a blade through the multilayer film laminate in a manner such that the perfluorinated copolymer resin top sheet, the second layer, and the foil lower layer of the laminate were sequentially cut. Parallel cuts were made that were separated by one inch. This provided 3-layer laminate samples that were one inch wide. The one-inch sections of the sample were cut so that the one inch width was parallel to the longest dimension of the perfluorinated copolymer resin top sheet and the samples were taken from the interior of the laminated (adhered) region, not from areas near the edges of the laminated region. The cuts ran from the laminated region through the unlaminated section of the perfluorinated copolymer resin sheet provided by the polyester slip sheet discussed above. The initiation point for the peel test was the boundary between the laminated and unlaminated areas of the sample.

Two multilayer film laminates were tested for each Example composition and each exposure condition. As many as three one inch width peel tests were performed for each laminate. Peel strengths reported represent an average value for up to fifteen tests per Example (five peels for each time point: the initial condition prior to damp heat treatment, after 500 hours damp heat treatment and after 1000 hours damp heat treatment). The multilayer laminated film samples were tested using a T-peel test according to the procedures of ASTM F904-91 "Standard Test Method For Comparison Of Bond Strength Of Ply Adhesion Of Similar Laminates Made From Flexible Materials". The average force during the constant steady-state peel propagation is reported. Peel strength results were recorded only for clean peels in which the fluoropolymer frontsheets completely peeled away from the second film layer (encapsulant) and foil layers. In cases where the laminate frontsheet broke before peeling occurred, or when the encapsulant layer remained adhered to the frontsheet and peeled away from the foil layer, no results were recorded.

Comparative Examples C1-C4

Multilayer laminates of aminosilane treated and non-treated ionomer-containing resins were prepared according to the above-described lamination procedure, wherein the fluoropolymer first layer was a corona-treated fluoropolymer resin that was not a perfluorinated copolymer resin, i.e. ETFE-1 resin. The ionomer-containing layer materials are identified in Table 1. Peel strength was tested under damp heat exposure conditions described above.

Results for lamination to ETFE-1 (PV3251 films) are reported in Table 1.

TABLE 1

| | | Adhesion to ETFE-1 Film After Exposure (lbf/in) | | | | | |
|---|---|---|---|---|---|---|---|
| | | Damp Heat Exposure Time | | | | | |
| | | 0 Hours | | 500 Hours | | 1000 Hours | |
| Sample | Layer 2 | Average | Standard Deviation | Average | Standard Deviation | Average | Standard Deviation |
| C1 | Ionomer 2 | 0.264 | 0.053 | 0.705 | 0.121 | 0.483 | 0.208 |
| C2 | Ionomer 2* APTMS | 0.258 | 0.186 | 16.838 | 2.191 | 19.517 | 1.937 |

TABLE 1-continued

Adhesion to ETFE-1 Film After Exposure (lbf/in)

| | | \multicolumn{6}{c}{Damp Heat Exposure Time} | | | | | |
|---|---|---|---|---|---|---|---|
| | | 0 Hours | | 500 Hours | | 1000 Hours | |
| Sample | Layer 2 | Average | Standard Deviation | Average | Standard Deviation | Average | Standard Deviation |
| C3 | Ionomer-3 | 25.051 | 6.49 | 0.608 | 0.071 | 0.699 | 0.162 |
| C4 | Ionomer-3* APTMS | 0.607 | 0.648 | 15.534 | 0.692 | 16.253 | 5.414 |

*Surface treated with APTMS

Comparative Examples C5 and C6 and Examples 1 and 2

Comparative Examples C5 and C6 were samples of ionomer-containing resin films that were not treated with aminosilane and were laminated to a perfluorinated copolymer resin film (FEP-1 film) according to the above-described lamination method. Examples 1 and 2 were samples of ionomer-containing resin films that had been surface-treated with aminosilane as described above and laminated to FEP-1 according to the above-described lamination method. Peel strengths between the ionomer-containing and fluoropolymer layers were determined under damp heat conditions according to the method described above and are reported in Table 2. Two multilayer film laminates were tested for each sample composition and each exposure condition. As many as three one inch width peel tests were performed for each laminate. Peel strengths reported in Table 2 represent an average value for up to fifteen tests per Example (five peels for each time point: the initial condition prior to damp heat treatment, after 500 hours damp heat treatment and after 1000 hours damp heat treatment).

TABLE 2

Adhesion to FEP-1 Film After Exposure (lbf/in)

| | | \multicolumn{6}{c}{Damp Heat Exposure Time} | | | | | |
|---|---|---|---|---|---|---|---|
| | | 0 Hours | | 500 Hours | | 1000 Hours | |
| Sample | Layer 2 | Average | Standard Deviation | Average | Standard Deviation | Average | Standard Deviation |
| C5 | Ionomer 2 | 0.263 | 0.011 | 0.344 | 0.028 | NA | NA |
| 1 | Ionomer-2/APTMS* | 9.72 | 6.054 | 4.716 | 0.784 | 5.28 | 7.005 |
| C6 | Ionomer-3 | 0.443 | 0.091 | 0.253 | 0.023 | NA | NA |
| 2 | Ionomer-3/APTMS* | 4.759 | 5.348 | 6.045 | 6.279 | 3.065 | 0.358 |

*Surface treated with APTMS

The data in Table 2 indicate poor adhesion of untreated ionomer films to corona-treated FEP-1 films. After aminosilane surface treatment, significantly better adhesion was observed, even after prolonged damp heat treatment.

Examples 3 and 4 and Comparative Examples C7 and C8

Light Transmission

A two layer laminate (Example 3) was prepared that was composed of a layer of Ionomer-3 that had been treated with APTMS according to the surface treatment method described above and a layer of FEP1. Lamination was conducted according to the above-described lamination method. Light transmission properties of the two-layer laminate were tested using the method described below and are reported in Table 3.

Similarly, two-layer laminates having the following structures were prepared:
Ionomer-3 treated with APTMS/ETFE-1 (Comparative Example C7);
Ionomer-2 treated with APTMS/FEP-1 (Example 4); and
Ionomer-2 treated with APTMS/ETFE-1 (Comparative Example C8). For purposes of illustration and comparison, the multilayer film laminates of this invention and the comparison standard laminates have the same structure and composition with the exception that the first layer of the comparison standard laminate comprises an ethylene tetrafluoroethylene copolymer resin, the compositions of the first layers of the multilayer film laminate and the comparison standard laminate being otherwise identical.

Light transmission properties were tested using the method described below and are summarized in Table 3.

Light Transmission Method

Light transmittance spectra were collected in accordance with ASTM E424, Solar Energy Transmittance and Reflectance (Terrestrial) of Sheet Materials, Method A, for spectrophotometric determinations. This method compares the light transmitted through a specimen to that transmitted through air (paragraph 6.4.1) using an integrating sphere spectrophotometer (paragraph 6.1.1). Total solar energy transmittance for a sample, in percent, can be determined by integrating the spectral transmittance over the standard solar energy distribution by multiplying the transmittance at a given wavelength by energy weighted ordinates (paragraph 6.5.1). Essentially equivalent results (paragraph 1.1) can be obtained by Method B, using the sun as a light source and a pyranometer as a detector (paragraph 4.2).

For the study reported herein, light transmission data were determined using a Varian Cary 5000 UV/VIS/NIR spectrophotometer (version 1.12) equipped with a DRA-2500 diffuse reflectance accessory, scanning from 2500 nm to 200 nm in 1 nm increments, averaging for 0.2 second over each increment, utilizing full slit height and operating in double beam mode. The DRA-2500 is a 150 mm integrating sphere with a SPECTRALON reflective coating. A total transmittance spectrum was obtained for each sample. Light transmission levels for selected wavelengths of the samples are reported in Table 3 as a percentage of transmission compared to the light transmitted through air.

TABLE 3

Light Transmission Level at Selected Wavelengths (%)

| Wavelength (nm) | Example 3 | Comparative Example C7 | Example 4 | Comparative Example C8 |
|---|---|---|---|---|
| 300 | 0.0 | 0.0 | 0.2 | 0.2 |
| 400 | 72.1 | 65.2 | 82.2 | 75.0 |
| 500 | 88.8 | 84.2 | 91.8 | 86.7 |
| 600 | 90.6 | 87.2 | 92.7 | 88.9 |
| 700 | 91.7 | 89.0 | 93.2 | 90.1 |
| 800 | 92.3 | 90.1 | 93.4 | 90.9 |

Multilayer film laminates that contained an FEP-1 layer had significantly better light transmission levels than Comparative Example multilayer film laminates that contained an ETFE-1 layer. This was the case at all wavelengths from 400 to 800 nm.

What is claimed is:

1. A method for preparing a transparent multilayer film laminate comprising at least a first film layer and a second film layer, the method comprising:
   A. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
   B. providing a second film layer comprising a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof;
   C. treating a surface of the second film layer with an aminosilane coupling agent to provide a surface-treated second film layer;
   D. contacting a treated surface of the surface-treated second film layer with the modified surface of the first film layer; and
   E. adhering the first film layer to the second surface-treated film layer by the application of heat and optionally pressure or vacuum to form a multilayer film laminate;
wherein the multilayer film laminate is characterized by (i) having an average peel strength between the first film layer and the second surface-treated film layer of greater than 2 lbf/in, measured after exposing the multilayer film laminate to conditions of 85° C. and 85% relative humidity for 1000 hours with the proviso that when the second film layer comprises an ethylene vinyl acetate copolymer, the multilayer film laminate is maintained at a sufficient temperature for a time sufficient to crosslink the ethylene vinyl acetate copolymer prior to exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

2. A method of claim 1 wherein treating the surface of the second film layer with an aminosilane coupling agent treated surface comprises applying a solution of the aminosilane coupling agent in a polar organic solvent to the second film layer and drying.

3. A method of claim 2 wherein the polar organic solvent comprises a low molecular weight alcohol having 8 or fewer carbon atoms.

4. A method of claim 1 wherein the aminosilane coupling agent is selected from the group consisting of 3-aminopropyltrimethoxysilane, gamma-aminopropyltriethoxysilane, N,N'-bis[(3-trimethoxysilyl)propyl]ethylenediamine, N-(2-aminoethyl)-3-aminopropyltrimethoxysilane, N-2-(vinylbenzylamino)-ethyl-aminopropyltrimethoxysilane, and mixtures of two or more thereof.

5. A method of claim 1 wherein the first film layer has a thickness in the range of 25 to 200 microns.

6. A method of claim 1 wherein the second film layer comprises an ethylene α,β-ethylenically unsaturated carboxylic acid copolymer or an ionomer of an ethylene α,β-ethylenically unsaturated carboxylic acid copolymer.

7. A method of claim 1 wherein the second film layer further comprises an organosilane coupling agent that may be the same as or different from the aminosilane coupling agent used to treat the surface of the second film layer, provided that when the second film layer comprises an ethylene α,β-ethylenically unsaturated carboxylic acid copolymer or ionomer of an ethylene α,β-ethylenically unsaturated carboxylic acid copolymer, the organosilane coupling agent does not comprise an aminosilane.

8. A method of claim 1 wherein the surface of the first film layer has been modified by a surface treatment selected from the group consisting of flame treatments, plasma treatments, electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof.

9. A method of claim 8 wherein the surface treatment is a corona discharge treatment.

10. A method of claim 1 wherein the second film layer comprises a crosslinked ethylene vinyl acetate copolymer.

11. A method for preparing a photovoltaic module, the method comprising the steps:
   A. providing a solar cell layer;
   B. providing a transparent multilayer film laminate that is larger in area than the solar cell layer, the multilayer film laminate comprising at least a first film layer and a second film layer, wherein
      1. the first film layer comprises a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;

2. the second film layer comprises a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof, wherein a surface of the second film layer has been treated with an aminosilane coupling agent to provide a surface-treated second film layer; and 3. the multilayer film laminate is characterized by (i) having an average peel strength between the first film layer and the second surface-treated film layer of greater than 2 lbf/in, measured after exposing the multilayer film laminate to conditions of 85° C. and 85% relative humidity for 1000 hours, with the proviso that when the second film layer comprises an ethylene vinyl acetate copolymer, the ethylene vinyl acetate is a crosslinked ethylene vinyl acetate; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical;

C. overlaying the solar cell layer with the multilayer film laminate such that 1. a surface of the second film layer of the multilayer film laminate contacts the solar cell layer;
2. a portion of the second film layer of the multilayer film laminate extends beyond the perimeter of the solar cell layer; and
3. the portion of the second film layer of the multilayer film laminate that extends beyond the perimeter of the solar cell layer contacts an additional layer that is an encapsulant layer; and D. adhering the second film layer of the multilayer film laminate to the solar cell layer and the encapsulant layer by the application of heat and optionally pressure or vacuum to provide a photovoltaic module.

12. A method of claim 11 wherein the encapsulant layer comprises a polymeric material selected from the group consisting of ethylene acid copolymers, ionomers of ethylene acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof.

13. A method of claim 9 wherein an additional layer is adhered to the surface of the encapsulant layer opposite the surface of the encapsulant layer that contacts portions of the surface of the second film layer.

14. A method for preparing a photovoltaic module comprising a multilayer laminate, the method comprising the steps:

A. providing a solar cell layer;
B. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
C. providing a second film layer having an upper and a lower surface, the second film layer being larger in area than the solar cell layer, wherein the second film layer comprises a polymeric material selected from the group consisting of α-olefin ethylenically unsaturated carboxylic acid copolymers, ionomers of α-olefin ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof;
D. treating the upper surface of the second film layer with an aminosilane coupling agent to provide a surface-treated second film layer;
E. contacting a modified surface of the first film layer with a treated upper surface of the surface-treated second film layer;
F. contacting the solar cell layer with the second film layer such that
    1. the lower surface of the second film layer contacts the solar cell layer;
    2. a portion of the second film layer extends beyond the perimeter of the solar cell layer; and
    3. the portion of the second film layer that extends beyond the perimeter of the solar cell layer contacts another layer that is an encapsulant layer; and
G. adhering the second film layer to the first film layer, the solar cell layer and the encapsulant layer by the application of heat and optionally pressure or vacuum to provide a photovoltaic module;

wherein the photovoltaic module is characterized by (i) having an average peel strength between the first film layer and the second surface-treated film layer of greater than 2 lbf/in, measured after exposing the photovoltaic module to conditions of 85° C. and 85% relative humidity for 1000 hours with the proviso that when the second film layer comprises an ethylene vinyl acetate copolymer, the photovoltaic module is maintained at a sufficient temperature for a time sufficient to crosslink the ethylene vinyl acetate copolymer prior to exposing the photovoltaic module to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

15. A method of claim 14 wherein treating the surface of the second film layer with an aminosilane coupling agent treated surface comprises applying a solution of the aminosilane coupling agent to the second film layer and drying.

16. A method of claim 14 wherein the aminosilane coupling agent is selected from the group consisting of 3-aminopropyltrimethoxysilane, gamma-aminopropyltriethoxysilane, N,N'-bis[(3-trimethoxysilyl)propyl]ethylenediamine, N-(2-aminoethyl)-3-aminopropyltrimethoxysilane, and N-2-(vinylbenzylamino)-ethyl-aminopropyltrimethoxysilane, and mixtures of two or more thereof.

17. A method of claim 14 wherein the second film layer comprises an ethylene acid copolymer or ionomer of an ethylene acid copolymer.

18. A method of claim 14, wherein the second film layer further comprises an organosilane coupling agent that may be the same as or different from the aminosilane coupling agent used to treat the surface of the second film layer, provided that when the second film layer comprises an ethylene $\alpha,\beta$-ethylenically unsaturated carboxylic acid copolymer or an ionomer of an ethylene $\alpha,\beta$-ethylenically unsaturated carboxylic acid copolymer, the organosilane coupling agent does not comprise an aminosilane.

19. A method of claim 14 wherein the encapsulant layer comprises a polymeric material selected from the group consisting of ethylene ethylenically unsaturated carboxylic acid copolymers, ionomers of ethylene ethylenically unsaturated carboxylic acid copolymers, ethylene vinyl acetate copolymers, poly(vinyl acetals), polyurethanes, polyvinylchlorides, polyethylenes, polyolefin block copolymer elastomers, copolymers of $\alpha$-olefins and ethylenically unsaturated carboxylic acid esters, silicone elastomers, epoxy resins, and combinations of two or more thereof.

20. The method of claim 14 wherein an additional layer is adhered to the surface of the encapsulant layer opposite the surface of the encapsulant layer that contacts portions of the surface of the second film layer.

* * * * *